United States Patent
Seo

(10) Patent No.: US 9,530,942 B2
(45) Date of Patent: Dec. 27, 2016

(54) SLIM LED PACKAGE

(71) Applicant: Seoul Semiconductor Co., Ltd., Ansan-si (KR)

(72) Inventor: Eun Jung Seo, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/816,532

(22) Filed: Aug. 3, 2015

(65) Prior Publication Data

US 2015/0340570 A1    Nov. 26, 2015

Related U.S. Application Data

(63) Continuation of application No. 14/624,172, filed on Feb. 17, 2015, which is a continuation of application
(Continued)

(30) Foreign Application Priority Data

Dec. 3, 2007 (KR) .......................... 10-2007-0124469

(51) Int. Cl.
*H01L 33/48* (2010.01)
*H01L 23/495* (2006.01)
(Continued)

(52) U.S. Cl.
CPC ....... *H01L 33/486* (2013.01); *H01L 23/49537* (2013.01); *H01L 23/49541* (2013.01);
(Continued)

(58) Field of Classification Search
CPC ................... H01L 23/49537; H01L 23/49541; H01L 23/486; H01L 23/62
(Continued)

(56) References Cited

U.S. PATENT DOCUMENTS 6,494,597 B1    12/2002 Yu
6,603,148 B1    8/2003 Sano et al.
(Continued)

FOREIGN PATENT DOCUMENTS

| JP | 62-140758 | 9/1987 |
|----|-----------|--------|
| JP | 63-200550 | 8/1988 |

(Continued)

OTHER PUBLICATIONS

European Search Report dated Mar. 7, 2012, in European Patent Application No. 08856932.2-1226.
(Continued)

*Primary Examiner* — Allan R Wilson
(74) *Attorney, Agent, or Firm* — H.C. Park & Associates, PLC

(57) ABSTRACT

Disclosed herein is a slim LED package. The slim LED package includes first and second lead frames separated from each other, a chip mounting recess formed on one upper surface region of the first lead frame by reducing a thickness of the one upper surface region below other upper surface regions of the first lead frame, an LED chip mounted on a bottom surface of the chip mounting recess and connected with the second lead frame via a bonding wire, and a transparent encapsulation material protecting the LED chip while supporting the first and second lead frames.

13 Claims, 4 Drawing Sheets

Related U.S. Application Data

No. 14/161,377, filed on Jan. 22, 2014, now Pat. No. 8,963,196, which is a continuation of application No. 13/631,060, filed on Sep. 28, 2012, now Pat. No. 8,659,050, which is a continuation of application No. 12/745,878, filed as application No. PCT/KR2008/006777 on Nov. 18, 2008, now Pat. No. 8,319,248.

(51) Int. Cl.
  *H01L 33/56* (2010.01)
  *H01L 33/54* (2010.01)
  *H01L 33/62* (2010.01)

(52) U.S. Cl.
  CPC ............. *H01L 33/54* (2013.01); *H01L 33/56* (2013.01); *H01L 33/62* (2013.01); *H01L 2224/48091* (2013.01); *H01L 2224/48247* (2013.01); *H01L 2224/8592* (2013.01)

(58) Field of Classification Search
  USPC .... 257/98–100, E33.059, E33.061, E33.066; 438/26
  See application file for complete search history.

(56) References Cited

U.S. PATENT DOCUMENTS

| | | | |
|---|---|---|---|
| 7,183,588 B2 | 2/2007 | Chia et al. | |
| 7,282,785 B2 | 10/2007 | Yoshida | |
| 7,291,866 B2 | 11/2007 | Oshio et al. | |
| 7,301,176 B2 | 11/2007 | Abe et al. | |
| 7,514,724 B2 * | 4/2009 | Ng | H01L 25/0753 257/100 |
| 7,592,639 B2 | 9/2009 | Maeda et al. | |
| 7,682,848 B2 | 3/2010 | Shimizu et al. | |
| 7,800,304 B2 | 9/2010 | Norfidathul et al. | |
| 7,960,819 B2 * | 6/2011 | Loh | H01L 33/642 257/676 |
| 8,093,619 B2 * | 1/2012 | Hayashi | H01L 33/486 257/100 |
| 8,390,022 B2 | 3/2013 | Hussell et al. | |
| 8,398,892 B2 | 3/2013 | Shioi et al. | |
| 8,471,271 B2 | 6/2013 | Son | |
| 8,558,270 B2 | 10/2013 | Seo et al. | |
| 2002/0079837 A1 | 6/2002 | Okazaki | |
| 2003/0107316 A1 | 6/2003 | Murakami et al. | |
| 2004/0047151 A1 | 3/2004 | Bogner et al. | |
| 2004/0104391 A1 | 6/2004 | Maeda et al. | |
| 2005/0151149 A1 | 7/2005 | Chia et al. | |
| 2005/0280017 A1 | 12/2005 | Oshio et al. | |
| 2006/0220047 A1 | 10/2006 | Nagatomi et al. | |
| 2006/0220048 A1 | 10/2006 | Matsumoto et al. | |
| 2007/0262339 A1 | 11/2007 | Hussell et al. | |
| 2008/0023714 A1 | 1/2008 | Chae et al. | |
| 2008/0023721 A1 | 1/2008 | Lee et al. | |
| 2008/0121921 A1 | 5/2008 | Loh et al. | |
| 2008/0237627 A1 | 10/2008 | Kobayakawa | |
| 2008/0273340 A1 * | 11/2008 | Ng | H01L 25/0753 362/373 |
| 2008/0296590 A1 | 12/2008 | Ng | |
| 2009/0224271 A1 | 9/2009 | Seo et al. | |
| 2010/0163913 A1 | 7/2010 | Jeganathan et al. | |
| 2015/0091040 A1 | 4/2015 | Kobayakawa | |

FOREIGN PATENT DOCUMENTS

| | | |
|---|---|---|
| JP | 02-125454 | 5/1990 |
| JP | 3-8459 | 1/1991 |
| JP | 2001-085747 | 3/2001 |
| JP | 2001-210872 | 8/2001 |
| JP | 2004-104153 | 4/2004 |
| JP | 2004-134805 | 4/2004 |
| JP | 2005-350649 | 12/2005 |
| JP | 2005-353914 | 12/2005 |
| JP | 2006-179541 | 7/2006 |
| JP | 2006-313943 | 11/2006 |
| JP | 2006-352085 | 12/2006 |
| JP | 2007-110060 | 4/2007 |
| JP | 2007-131843 | 5/2007 |
| KR | 10-2002-0065729 | 8/2002 |
| KR | 10-2006-0059575 | 6/2006 |
| TW | 501276 | 9/2002 |
| TW | 200522396 | 7/2005 |
| TW | I246780 | 1/2006 |
| TW | 200636049 | 10/2006 |
| WO | 2006/059828 | 6/2006 |

OTHER PUBLICATIONS

Taiwanese Office Action dated Jun. 1, 2012, in U.S. Appl. No. 12/745,878.
Non-Final Office Action dated Mar. 28, 2012, in U.S. Appl. No. 12/745,878.
Notice of Allowance dated Aug. 1, 2012, in U.S. Appl. No. 12/745,878.
Non-Final Office Action dated Jul. 2, 2013, in U.S. Appl. No. 13/631,060.
Notice of Allowance dated Oct. 18, 2013, in U.S. Appl. No. 13/631,060.
Non-Final Office Action dated Jun. 26, 2014, in U.S. Appl. No. 14/161,377.
Notice of Allowance dated Oct. 17, 2014, in U.S. Appl. No. 14/161,377.
Non-Final Office Action dated Jul. 9, 2015, in U.S. Appl. No. 14/624,172.
Oxford Dictionaries Online (http://www.oxforddictionaries.com/us/definition/american_english/vertex), "vertex," last retrieved Jun. 29, 2015, pp. 6-7.
Non-Final Office Action issued on Feb. 22, 2016, in U.S. Appl. No. 14/624,172.
Notice of Allowance issued May 4, 2016, in U.S. Appl. No. 14/624,172.

* cited by examiner

SLIM LED PACKAGE

CROSS-REFERENCE TO RELATED APPLICATIONS

This application is a continuation of U.S. patent application Ser. No. 14/624,172, filed on Feb. 17, 2015, which is a continuation of U.S. patent application Ser. No. 14/161,377, filed on Jan. 22, 2014, now U.S. Pat. No. 8,963,196, which is a continuation of U.S. patent application Ser. No. 13/631,060, filed on Sep. 28, 2012, now U.S. Pat. No. 8,659,050, which is a continuation of U.S. patent application Ser. No. 12/745,878, filed on Jun. 2, 2010, now U.S. Pat. No. 8,319,248, which is the National Stage Entry of International Patent Application No. PCT/KR2008/006777, filed on Nov. 18, 2008, and claims priority from and the benefit of Korean Patent Application No. 10-2007-0124469, filed on Dec. 3, 2007, which are all hereby incorporated by reference for all purposes as if fully set forth herein.

BACKGROUND OF THE INVENTION

Field of the Invention

The present invention relates to a light emitting diode (LED) package and, more particularly, to a slim LED package that is significantly reduced in thickness without substantially reducing luminescence efficiency or while improving the luminescence efficiency.

Discussion of the Background

An LED emits light through recombination of electrons and holes by application of an electric current. An LED package means a package structure in which a light emitting diode chip, that is, an LED chip, is received. Many kinds of LED packages, particularly, a lead frame type LED package and a printed circuit board (PCB) type LED package, are well known in the art. The lead frame type LED package has a structure wherein a cavity of a housing for supporting a lead frame is filled with an encapsulation material, with the LED chip positioned in the cavity of the housing. The PCB type LED package has a structure wherein the LED chip is directly mounted on a PCB and covered with the encapsulation material.

For the lead frame type LED package, the housing supporting the lead frame has an excessive thickness, which makes it difficult to fabricate a thin lead frame type LED package. On the other hand, since the PCB type LED package does not include a housing, it can be more easily fabricated to have a thin structure than the lead frame type LED package.

However, there are many restrictions in thickness reduction of the PCB type LED package. In other words, since the thickness of the PCB type LED package is determined by thicknesses of the PCB and LED chips, and a loop height of a bonding wire even without considering the encapsulation material, it is difficult to achieve an overall thickness reduction and slimness of the PCB type LED package.

Further, the encapsulation material of the LED package, which covers the LED chip, undergoes a yellowing phenomenon by energy generated from the LED chip emitting light. Such a yellowing phenomenon is a main cause of decreased luminescence performance and lifetime of the LED package. To overcome such problems, new LED packages have been developed to have a heat sink structure. In detail, the lead frame type LED package further includes a heat dissipation slug inserted into the housing by molding. Such a structure of the lead frame type LED package requires addition of components and a complicated manufacturing process, thereby decreasing economic feasibility. For the PCB type LED package, B-T resin on which the LED chip is mounted has a low heat dissipation performance, and it is difficult to have the heat sink structure.

SUMMARY OF THE INVENTION

Therefore, an aspect of the present invention is to provide a slim LED package that is configured to allow a transparent encapsulation material to directly support a lead frame without a housing, that has a reduced overall thickness by reducing the thickness of a chip mounting region of the lead frame, and that exhibits good heat dissipation performance.

In accordance with an aspect of the present invention, a slim LED package includes: first and second lead frames separated from each other; a chip mounting recess formed on one upper surface region of the first lead frame by reducing a thickness of the one upper surface region below other upper surface regions of the first lead frame; an LED chip mounted on a bottom surface of the chip mounting recess and connected with the second lead frame via a bonding wire; and a transparent encapsulation material protecting the LED chip while supporting the first and second lead frames. The LED chip may have a thickness lower than or equal to a depth of the chip mounting recess.

The chip mounting recess may be formed by thickness-etching the one upper surface region of the first lead frame. Herein, the term "thickness-etching" refers to etching performed to reduce the thickness of a material, that is, the thickness of the one upper surface region of the lead frame.

The slim LED package may further include a bonding recess formed on one upper surface region of the second lead frame by reducing a thickness of the one upper surface region of the second lead frame below other upper surface regions of the second lead frame, one end of the bonding wire being bonded into the bonding recess. The bonding recess may be formed by thickness-etching the one upper surface region of the second lead frame.

The slim LED package may further include openings or grooves formed on an upper or lower surface of the first or second lead frame to increase a bonding force between the first and second lead frames and the encapsulation material. Alternatively, the slim LED package may further include scratches formed on an upper or lower surface of the first or second lead frame to increase the bonding force between the first and second lead frames and the encapsulation material. Further, the LED chip may have a lower height than the depth of the chip mounting recess. The first and second lead frames may have opposite sides facing each other and including linear or rounded slant parts facing each other in a slanted state. At least one of the opposite sides may have a depressed part formed thereon to widen a separation between the first lead frame and the second lead frame.

The slim LED package may further include a phosphor in the encapsulation material. The slim LED package may further include an adjacent resin part formed in the chip mounting recess inside the encapsulation material, and the phosphor may be disposed in the adjacent resin part. Alternatively, the phosphor may be disposed in a resin constituting the encapsulation material or may be coated on the LED chip by conformal coating.

The encapsulation material may be formed by transfer molding with a solid resin, particularly, a solid EMC. Alternatively, the encapsulation material may be formed by injection molding with a liquid resin.

According to one embodiment of the present invention, the LED package is configured to mount an LED chip on a chip mounting recess, which is formed on a predetermined region of a lead frame by reducing the thickness of the predetermined region, such that the thickness of the LED chip partially overlaps the thickness of the lead frame, whereby the LED package can be significantly reduced in overall thickness, achieving an ultrathin slimness. Further, the lead frame on which the LED chip is mounted and the lead frame with which a bonding wire is connected have a significantly increased area exposed to the bottom, so that the LED package has greatly improved thermal dissipation efficiency. Additionally, a bonding recess is formed on the lead frame by reducing the thickness of a part of the lead frame with which the bonding wire is connected, and is provided therein with a wire ball to be connected with the bonding wire. As a result, a factor causing an increase in thickness of the LED package can be eliminated, so that the LED package is further slimmed. Further, according to one embodiment of the present invention, openings or grooves are formed on the lead frames to increase a bonding force between the lead frames and an encapsulation material, thereby preventing separation of an interfacial surface between the encapsulation material and the lead frames. Moreover, an inside surface of the chip mounting recess serves to improve luminescence efficiency, as compared to a conventional PCB type LED package that is configured to reflect light emitted from the LED chip to an upper side.

BRIEF DESCRIPTION OF THE DRAWINGS

The above and other aspects, features and advantages of the present invention will be more clearly understood from the following detailed description taken in conjunction with the accompanying drawings, in which.

DETAILED DESCRIPTION OF THE ILLUSTRATED EMBODIMENTS

Figure 1:
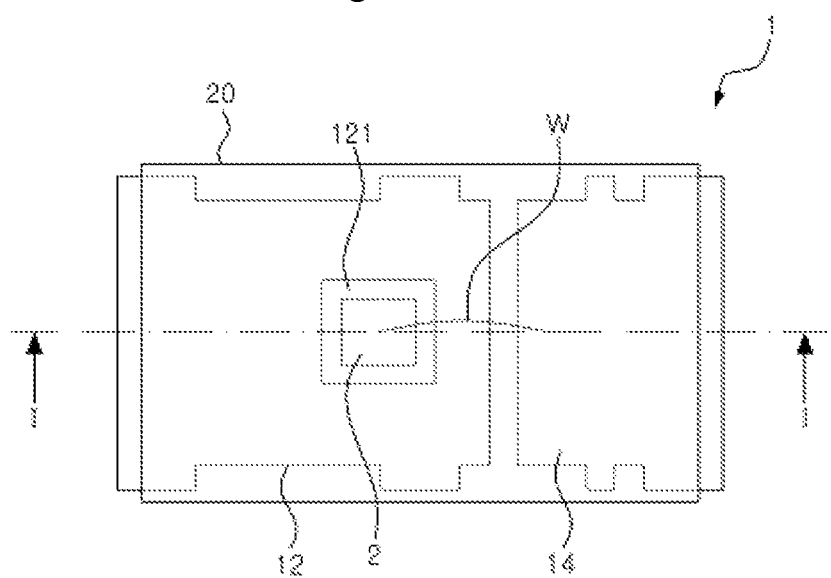
FIG. 1 is a plan view of a slim LED package according to one embodiment of the present invention.

Exemplary embodiments of the present invention will be described in detail with reference to the accompanying drawings. The embodiments are given by way of illustration for complete understanding of the present invention by those skilled in the art. Hence, the present invention is not limited to these embodiments and can be realized in various forms. Further, for convenience of description, width, length, and thickness of components are not drawn to scale in the drawings. Like components are indicated by like reference numerals throughout the specification.

Figure 2:
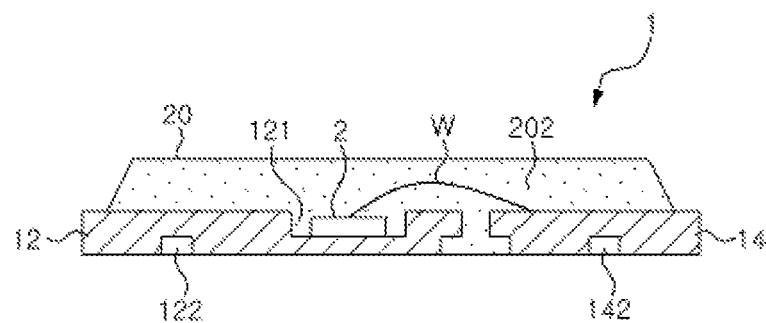
FIG. 2 is a cross-sectional view taken along line I-I of FIG. 1.

FIG. 1 is a plan view of a slim LED package 1 according to one embodiment of the invention, and FIG. 2 is a cross-sectional view taken line I-I of FIG. 1.

Referring to FIGS. 1 and 2, a slim LED package 1 of this embodiment includes first and second lead frames 12, 14 separated from each other. The first lead frame 12 has an LED chip 2 mounted thereon, and the second lead frame 14 is electrically connected with the LED chip 2 via a bonding wire W. The bonding wire W is connected with the second lead frame 14 via a wire ball or soldering ball (not shown).

The first and second lead frames 12, 14 are supported by a transparent encapsulation material 20. The transparent encapsulation material 20 is formed to entirely cover and protect the LED chip 2 and bonding wire W by molding. The encapsulation material 20 may be formed by transfer molding with an epoxy molding compound that is a solid epoxy resin. For example, the transfer molding is performed by compressing epoxy molding compound (EMC) powder at a proper pressure into a tablet-shape, followed by positioning and molding the tablet-shaped EMC in a mold at high temperature and pressure conditions to form the encapsulation material 20.

In this embodiment, the encapsulation material 20 is formed by transfer molding, but the present invention is not limited thereto. Alternatively, the encapsulation material 20 can be formed by injection molding, in which a liquid resin is injected into a mold. The encapsulation material 20 may be formed of other kinds of transparent resins such as epoxy-based or silicone-based resins, as well as the EMC.

The first lead frame 12 is formed with a chip mounting recess 121 on its upper surface, and the chip mounting recess 121 has the LED chip 2 mounted on a bottom surface thereof in a die-attachment manner. The chip mounting recess 121 is formed by reducing the thickness of one upper surface region of the first lead frame 12 below other regions of the first lead frame 12, instead of bending the lead frame to form a reflection cup as in the prior art. Accordingly, the first lead frame 12 has a decreased thickness only in the region of the first lead frame 12 where the LED chip 2 is mounted, whereby a mounting height of the LED chip 2 is lowered to contribute to slimness of the LED package 1 through an overall thickness reduction of the LED package 1. Further, an inside surface of the chip mounting groove 121 serves as a reflector for reflecting light, thereby enhancing luminescence efficiency of the LED package 1.

The chip mounting recess 121 may be formed by thickness-etching, which is performed for the purpose of reducing the thickness of the lead frame. At this time, etching can be performed, with the upper surface of the first lead frame 12 except for the chip mounting region covered with a mask. Further, the chip mounting recess 121 may have a thickness of about half of the thickness of the first lead frame 12. However, it should be noted that the present invention is not limited thereto.

Further, the LED chip 2 may have a thickness less than or equal to the depth of the chip mounting recess 121 to prevent the height of the LED chip 2 from affecting a thickness increase of the LED package 1. In other words, it is desirable that the depth of the chip mounting recess 121 be set greater than or equal to the height of the LED chip 2.

Figure 8A:
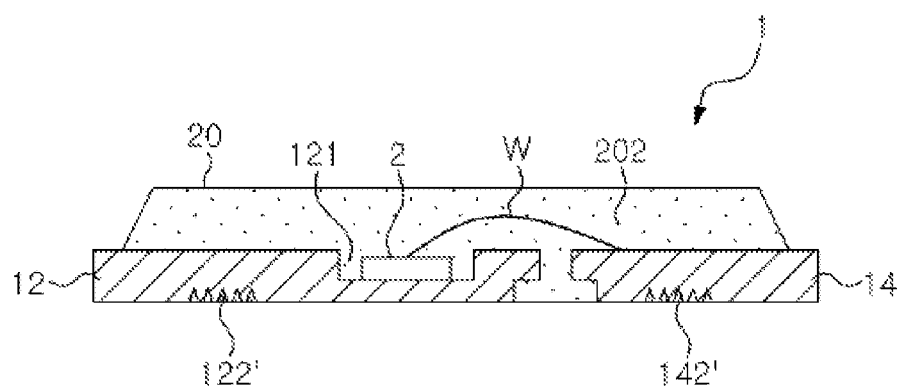
FIGS. 8(a) and 8(b) are cross-sectional views of a slim LED package according to an embodiment of the present invention.
Figure 8B:
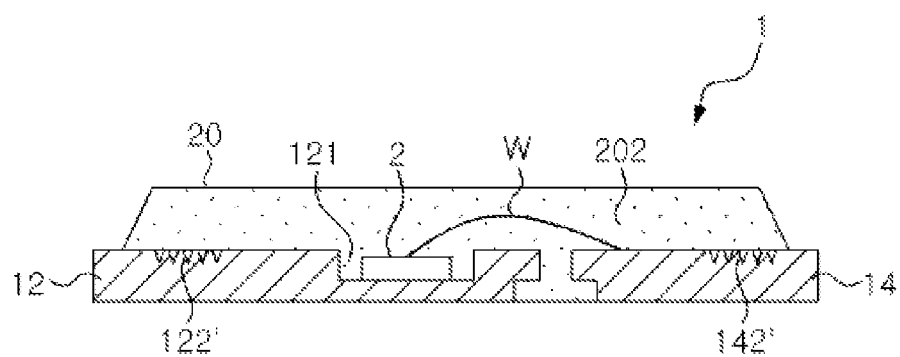

As clearly shown in FIG. 2, the first and second lead frames 12, 14 are respectively formed on lower surfaces thereof with grooves 122, 142, which are filled with a portion of the encapsulation material 20 during the molding process. As a result, the portion of the encapsulation material 20 engages with the grooves 122, 142, and a contact area between the lead frames 12, 14 and the encapsulation material 20 increases, thereby increasing a bonding force between the encapsulation material 20 and the lead frames 12, 14. The grooves 122, 142 are also formed by reducing the thickness of predetermined regions of the lower surfaces of the first and second lead frames 12, 14, and preferably by thickness-etching as described above. Alternatively, instead of forming the openings or grooves, as shown in FIG. 8(a) and FIG. 8(b), scratches 122' and 142' may be formed on the upper or lower surfaces of the first and second lead frames 12, 14, respectively, to increase the bonding force between the lead frames 12, 14 and the encapsulation material 20.

Referring again to FIG. 2, the encapsulation material 20 contains a phosphor 202 that is excited by light of a predetermined wavelength and emits light of a different wavelength. The phosphor 202 contributes to generation of white light through wavelength conversion by converting light emitted from the LED chip 2. In this embodiment, the phosphor 202 is mixed with a resin prepared as a molding material and is disposed in the encapsulation material 20 by the molding process using the molding material. For example, when forming the encapsulation material 20 by transfer molding, a mixture of EMC and the phosphor 202 is prepared and used as the material for the transfer molding.

Next, various other embodiments of the present invention will be described. In description of the embodiments, a repetitious description will be omitted, and, the same or similar elements will be denoted by the same reference numerals as those of the above description.

Figure 3:
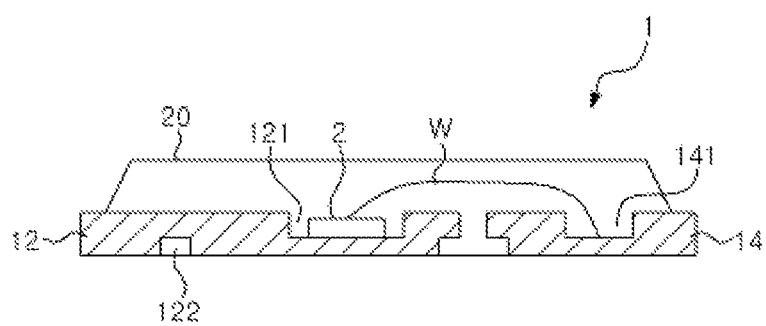
FIGS. 3 to 5 are cross-sectional views of slim LED packages according to various embodiments of the present invention.

In FIG. 3, a bonding recess 141 is shown, which is formed by reducing the thickness of one upper surface region of a second lead frame 14 below the thickness of other regions thereof. The bonding recess 141 can also be formed by the thickness-etching as in the formation of the chip mounting recess 121 of the aforementioned embodiment. At this time, one end of a bonding wire W is connected with the second lead frame 14 within the bonding recess 141.

Although not shown in the drawings, a wire ball is located in the bonding recess 141 such that the one end of the bonding wire W is connected with the wire ball in the bonding recess 141, thereby preventing a thickness increase of the LED package due to the height of the wire ball. A size increase of the wire ball ensures that the bonding wire W can be more rigidly secured to the second lead frame 14. Here, the formation of the bonding recess 141 enables more freedom to increase the size of the wire ball.

Figure 4:
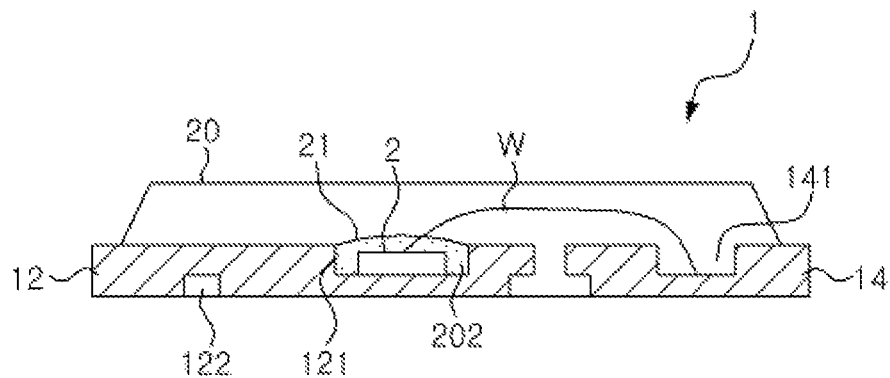

Referring to FIG. 4, in another embodiment of the present invention, a resin 21 containing a phosphor 202 is restrictively provided in the chip mounting recess 121 to cover the LED chip 2 in an adjacent distance. Herein, the resin 21 filling in the chip mounting recess 121 will be defined as an "adjacent resin part." The adjacent resin part 21 prevents the phosphor 202 from being scattered within the encapsulation material 20, and allows the phosphor 202 to be located around the LED chip 2. This configuration can improve color conversion efficiency by the phosphor 202, and can provide light consisting of uniformly mixed colors when viewed outside the LED package 1.

Alternatively, the adjacent resin part 21 may not contain the phosphor 202. For example, the encapsulation material such as epoxy is vulnerable to heat, and can cause thermal deformation or a yellowing phenomenon around the LED chip 2. Here, when the adjacent resin part 21 formed in the chip mounting recess 121 is made of a silicone resin, which is essentially invulnerable to heat, it is possible to efficiently prevent deterioration in performance or lifetime of the LED package 1 caused by the yellowing phenomenon. When using the silicone as a material for the adjacent resin part 21 to prevent thermal deformation or the yellowing phenomenon, the phosphor 202 can be included in the adjacent resin part 21 or omitted therefrom without any influence on the effect of preventing thermal deformation or the yellowing phenomenon.

Figure 5:
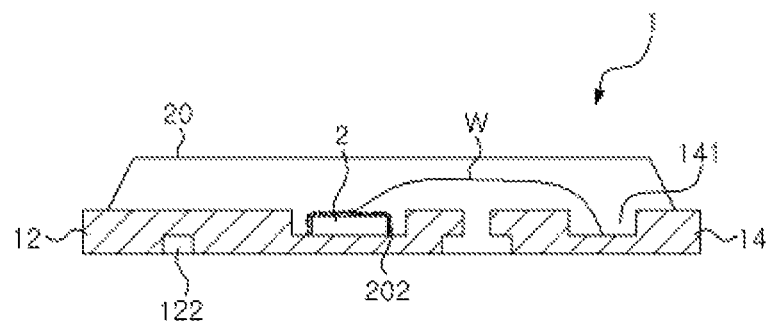

Alternatively, the phosphor 202 can be coated on the surface of the LED chip 2 by, for example, conformal coating via electrophoresis. In this case, the LED package 1 has a configuration as illustrated in FIG. 5.

Figure 6:
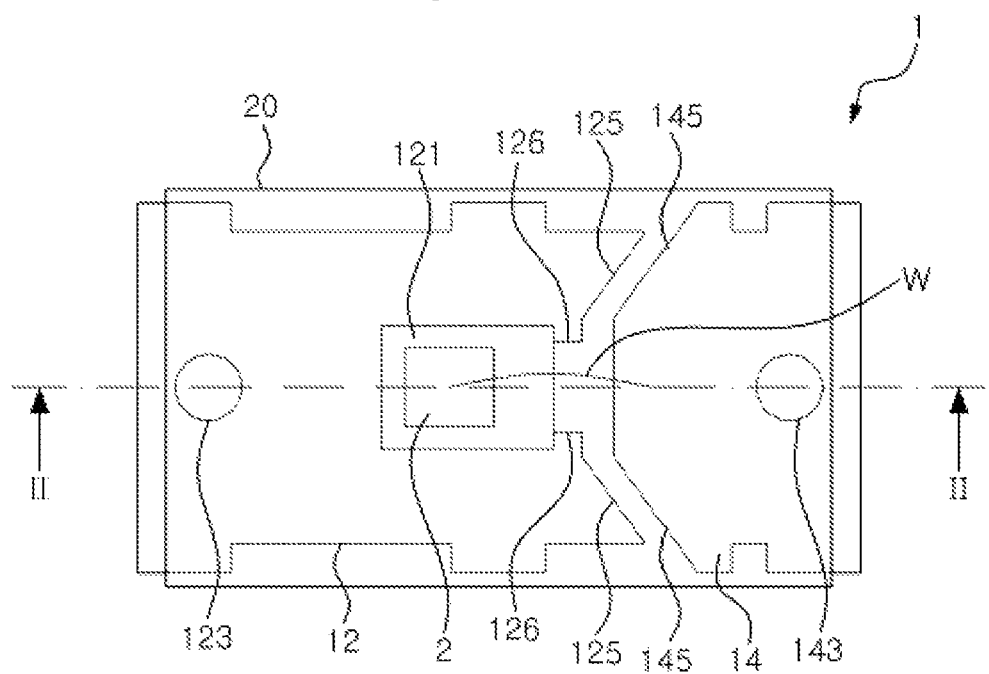
FIG. 6 is a cross-sectional view of a slim LED package according to yet another embodiment of the present invention.
Figure 7:
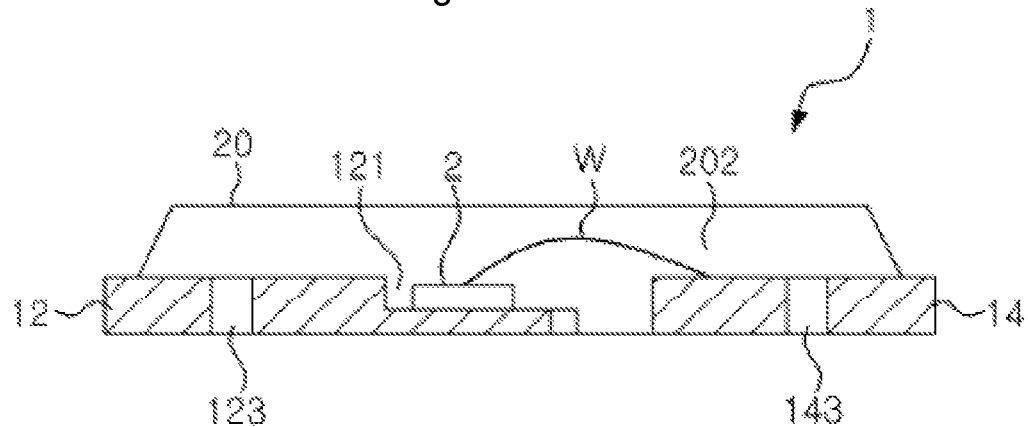
FIG. 7 is a cross-sectional view taken along line II-II of FIG. 6.

FIG. 6 is a cross-sectional view of a slim LED package 1 according to yet another embodiment of the present invention, and FIG. 7 is a cross-sectional view taken along line II-II of FIG. 6.

Referring to FIGS. 6 and 7, instead of the grooves 122, 142 (see FIG. 2) of the above embodiment, first and second lead frames 12, 14 of this embodiment are formed with openings 123, 143, which penetrate the first and second lead frames 12, 14 in the vertical direction, to increase the bonding force between an encapsulation material 20 and the lead frames 12, 14. The openings 123, 143 can be formed by pressing or by etching the lead frames 12, 14 in the thickness direction.

As clearly shown in FIG. 6, the first and second lead frames 12, 14 include first and second slant parts 125, 145, which are formed on opposite sides of the lead frames 12, 14 facing each other in an inclined state. That is, the first slant part 125 is formed on one side of the first lead frame 12 facing the other side of the second lead frame 14 to be inclined towards right and left sides of the first lead frame 12. Further, the second slant part 145 is formed on the other side of the second lead frame 14 facing the one side of the first lead frame 12 to be inclined towards right and left sides of the second lead frame 14. The first and second slant parts 125, 145 may have a linear or curved shape.

A portion of the encapsulation material 20 is interposed between the opposite sides of the first and second lead frames 12, 14 facing each other, and a force is applied to the interposed portion of the encapsulation material 20 and the opposite sides of the first and second lead frames 12, 14. At this time, the slant parts 125, 145 disperse the force diagonally, thereby preventing the encapsulation material 20 from being broken on the opposite sides of the lead frames 12, 14. Furthermore, since the slant part 125 of the first lead frame 12 has a shape surrounding the portion of the encapsulation material 20 adjacent thereto, it serves to more rigidly hold the encapsulation material 20. It should be noted that the breakage of the encapsulation material 20 between the opposite sides of the lead frames 12, 14 may cause electric shorts or the like.

Additionally, a depressed part 126 is formed at the center of the one side of the first lead frame 12 facing the other side of the second lead frame 14 to increase a separation between the first lead frame 12 and the second lead frame 14. The depressed part 126 is located directly below a path of the bonding wire W which connects the first lead frame 12 with the second lead frame 14. The depressed part 126 prevents the bonding wire W from being erroneously brought into contact with the lead frames 12, 14, and an electric short of the bonding wire W caused by the erroneous contact.

To fabricate the LED packages 1 as described above, a single metal sheet is processed to have a pattern of first and second lead frames 12, 14, followed by molding an encapsulation material 20 on the patterned metal sheet. Then, the lead frames 12, 14 are sawn per each encapsulation material 20 supporting a pair of first and second lead frames 12, 14, thereby providing a plurality of LED packages 1. At this time, a process of removing burrs formed during sawing may be further included.

Although the present invention has been described with reference to the embodiments and the accompanying drawings, the present invention is not limited to these embodiments and the drawings. It should be understood that various modifications, additions and substitutions can be made by a person having ordinary knowledge in the art without departing from the scope and spirit of the invention, as defined only by the accompanying claims.

What is claimed is:

1. A light emitting diode (LED) package, comprising:
a first lead frame and a second lead frame separated from each other;
an LED chip disposed on the first lead frame and electrically connected with the second lead frame; and
a resin covering at least portions of surfaces of the first and second lead frames,
wherein:
at least one of the first and second lead frames comprises a first side facing the other lead frame and a second side opposite the first side;
the first lead frame comprises a first groove disposed on a lower surface thereof, and the second lead frame comprises a second groove disposed on the lower surface thereof;
each of the first and second grooves is open only on the lower surfaces of the first and second lead frames, respectively;
and
a depth of the first groove is equal to a depth of the second groove.

2. The LED package of claim 1, wherein the first groove is disposed along the first side of at least one of the first and second lead frames.

3. The LED package of claim 1, wherein at least a portion of the lower surface of at least one of the first and second lead frames is not covered by the resin.

4. The LED package of claim 3, wherein at least a portion of the second side of at least one of the first and second lead frames is not covered by the resin.

5. The LED package of claim 1, wherein at least one of the first and second lead frames comprises at least one protrusion disposed on at least one side thereof.

6. The LED package of claim 5, wherein:
at least one of the first and second lead frames further comprises a third side and a fourth side opposite the third side, and the third and fourth sides are disposed between the first and second sides; and
the protrusion protrudes from at least one of the third side and the fourth side.

7. The LED package of claim 6, wherein the protrusion is disposed on an imaginary line which extends from the third side to the fourth side.

8. The LED package of claim 7, wherein the imaginary line is substantially perpendicular to the third side.

9. The LED package of claim 1, wherein the groove is formed by reducing a thickness of predetermined region of the lower surface of at least one of the first and second lead frames.

10. The LED package of claim 1, wherein the resin fills at least a portion of the first groove.

11. The LED package of claim 1, wherein an area of an upper surface of the first lead frame is greater than an area of the lower surface of the first lead frame.

12. The LED package of claim 1, wherein the first groove and the second groove are disposed on an imaginary line which extends from the first side to the second side.

13. The LED package of claim 12, wherein the imaginary line is substantially perpendicular to the first side.

* * * * *